(12) United States Patent
Kim et al.

(10) Patent No.: US 11,587,975 B2
(45) Date of Patent: Feb. 21, 2023

(54) DISPLAY DEVICE

(71) Applicant: Samsung Display Co., LTD., Yongin-si (KR)

(72) Inventors: Jee Hoon Kim, Cheonan-si (KR); Jae Seol Cho, Seoul (KR); Jong Moo Huh, Hwaseong-si (KR); Sung Jae Moon, Seongnam-si (KR); Hui-Won Yang, Seoul (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 84 days.

(21) Appl. No.: 16/998,470

(22) Filed: Aug. 20, 2020

(65) Prior Publication Data
US 2021/0151497 A1 May 20, 2021

(30) Foreign Application Priority Data

Nov. 14, 2019 (KR) ........................ 10-2019-0145891

(51) Int. Cl.
*H01L 27/15* (2006.01)
*H01L 33/38* (2010.01)
*H01L 33/58* (2010.01)
*H01L 33/62* (2010.01)

(52) U.S. Cl.
CPC ............ *H01L 27/156* (2013.01); *H01L 33/38* (2013.01); *H01L 33/58* (2013.01); *H01L 33/62* (2013.01)

(58) Field of Classification Search
CPC ....... H01L 27/156; H01L 33/38; H01L 33/58; H01L 33/62; H01L 29/78618; H01L 27/1214; H01L 27/1218; H01L 27/3262; H01L 27/1262; H01L 27/3276; H01L 29/786

See application file for complete search history.

(56) References Cited

U.S. PATENT DOCUMENTS

| | | | |
|---|---|---|---|
| 5,880,512 A | 3/1999 | Gordon et al. | |
| 2011/0127526 A1* | 6/2011 | Kawae | H01L 29/78606 257/E29.296 |
| 2014/0077211 A1* | 3/2014 | Xi | H01L 29/786 257/71 |
| 2015/0055041 A1* | 2/2015 | Jiang | H01L 27/1214 257/72 |
| 2016/0349565 A1* | 12/2016 | Kim | G02F 1/13394 |
| 2021/0408145 A1* | 12/2021 | Zhang | H01L 27/3276 |
| 2022/0005976 A1* | 1/2022 | Kishimoto | H01L 33/502 |

FOREIGN PATENT DOCUMENTS

| | | |
|---|---|---|
| JP | 6145493 | 6/2017 |
| KR | 10-2015-0001012 | 1/2015 |
| KR | 10-2019-0069053 | 6/2019 |

* cited by examiner

*Primary Examiner* — Victor A Mandala
(74) *Attorney, Agent, or Firm* — Kile Park Reed & Houtteman PLLC (57) ABSTRACT

A display device includes a substrate; a semiconductor layer disposed on the substrate; a gate insulating film disposed on the semiconductor layer; a gate layer disposed on the gate insulating film and insulated from the semiconductor layer; an insulating film disposed on the semiconductor layer and the gate layer; and a metal layer disposed on the insulating film, wherein the semiconductor layer and the gate layer are electrically connected through the metal layer, and the semiconductor layer overlaps the gate layer in a plan view.

11 Claims, 10 Drawing Sheets

DISPLAY DEVICE

CROSS-REFERENCE TO RELATED APPLICATIONS

This application claims priority to and benefits of Korean Patent Application No. 10-2019-0145891 under 35 U.S.C. § 119, filed on Nov. 14, 2019 in the Korean Intellectual Property Office, the entire contents of which are incorporated herein by reference.

BACKGROUND

1. Technical Field

The disclosure relates to a display device, and, to a display device that may prevent a defect due to a step.

2. Description of the Related Art

Light emitting diode displays as self-light emitting display devices have recently attracted attention as devices for displaying an image or images.

The light emitting diode display may include a light emitting diode including a light emitting layer, an anode, and a cathode, and a driving element (for example, a transistor, a capacitor, etc.) for driving the light emitting diode. The light emitting diode display may include a display panel using a principle in which holes and electrons injected from the anode and the cathode, respectively, recombine in the light emitting layer to form excitons, and light having a specific wavelength is generated by energy emission of the formed excitons.

In order to realize high resolution of a display device, a large number of light emitting diodes may be disposed in the display device, thus distances between wires of the light emitting diodes and the driving elements may be narrowed.

The above information disclosed in this Background section is only for enhancement of understanding of the background of the disclosure, and therefore it may contain information that does not form the prior art that may already be known to a person of ordinary skill in the art.

SUMMARY

Embodiments provide a display device that may prevent a defect due to a step between wires.

An embodiment may provide a display device, including a substrate; a semiconductor layer disposed on the substrate; a gate insulating film disposed on the semiconductor layer; a gate layer disposed on the gate insulating film and insulated from the semiconductor layer; an insulating film disposed on the semiconductor layer and the gate layer; and a metal layer disposed on the insulating film, wherein the semiconductor layer and the gate layer may be electrically connected through the metal layer, and the semiconductor layer may overlap the gate layer in a plan view.

The insulating film may include a first opening overlapping the gate layer and a second opening overlapping the semiconductor layer, the metal layer and the gate layer may electrically contact each other through the first opening, and the metal layer and the semiconductor layer may electrically contact each other through the second opening.

The gate layer may be a gate electrode.

The display device may include a data line, and the metal layer and the data line may be disposed on a same layer.

An entire area of the gate layer may overlap the semiconductor layer.

The gate layer may partially overlap the semiconductor layer.

The gate layer and the gate insulating film may be formed by a same etching process.

The display device may include a barrier layer disposed between the semiconductor layer and the substrate.

The barrier layer may be continuous with the gate layer and the semiconductor layer.

A width of an area in which the semiconductor layer and the gate layer may overlap in a plan view may be about 2 μm or more.

Another embodiment may provide a display device, including a substrate; a light blocking layer disposed on the substrate; a gate insulating film disposed on the light blocking layer; a gate layer disposed on the gate insulating film and insulated from the light blocking layer; an insulating film disposed on the light blocking layer and the gate layer; and a metal layer disposed on the insulating film, wherein the light blocking layer and the gate layer may be electrically connected through the metal layer, and the light blocking layer may overlap the gate layer in a plan view.

The insulating film may include a first opening overlapping the gate layer and a second opening overlapping the light blocking layer, the metal layer and the gate layer may electrically contact each other through the first opening, and the metal layer and the light blocking layer may electrically contact each other through the second opening.

The gate layer may be a gate electrode.

The display device may include a data line, and the metal layer and the data line may be disposed on a same layer.

An entire area of the gate layer may overlap the light blocking layer.

The gate layer may partially overlap the light blocking layer.

The gate layer and the gate insulating film may be formed by a same etching process.

The display device may include a barrier layer disposed between the light blocking layer and the gate layer.

The barrier layer may be continuous with the light blocking layer and the gate layer.

A width of an area in which the light blocking layer and the gate layer may overlap in a plan view may be about 2 μm or more.

According to the embodiments, a display device that may prevent a defect due to a step between wires is provided.

DETAILED DESCRIPTION OF THE EMBODIMENTS

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

Some of the parts which are not associated with the description may not be provided in order to describe embodiments of the disclosure and like reference numerals refer to like elements throughout the specification.

Further, in the drawings, the size and thickness of each element may be arbitrarily illustrated for ease of description, and the disclosure is not necessarily limited to those illustrated in the drawings. In the drawings, the thicknesses of layers, films, panels, areas, regions, etc., may be exaggerated for clarity and for ease of description. In the drawings, for ease of description, the thicknesses of some layers and areas may be exaggerated.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that although terms such as "first" and "second" may be used herein to describe various components, these components should not be limited by these terms and these terms are only used to distinguish one component from another component.

In addition, unless explicitly described to the contrary, the word "comprise" and variations such as "comprises" or "comprising", "include", "includes", or "including" will be understood to imply the inclusion of stated elements but not the exclusion of any other elements.

Further, throughout the specification, the phrase "in a plan view" means viewing a target portion from the top, and the phrase "in a schematic cross-sectional view" means viewing a schematic cross-section formed by vertically cutting a target portion from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of is intended to include the meaning of" at least one selected from the group of for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described in detail with reference to the accompanying drawings.

Figure 1:
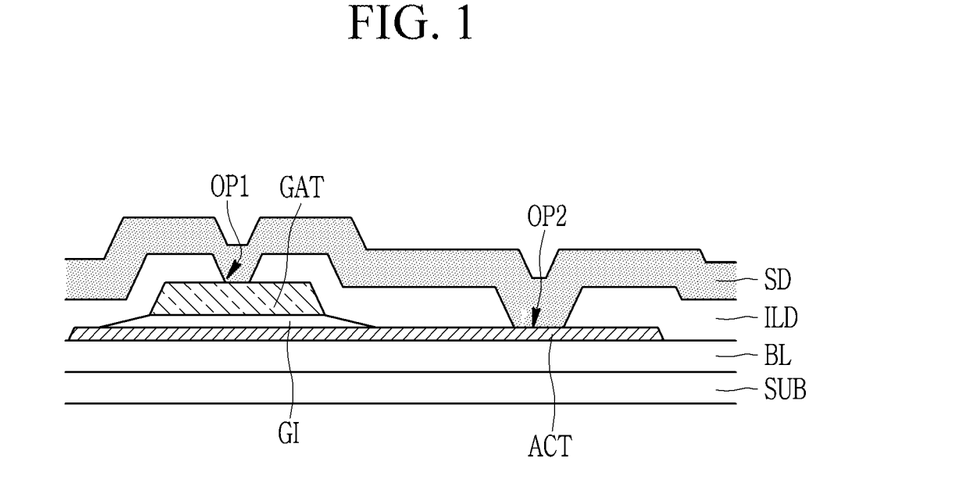
FIG. 1 illustrates a schematic cross-sectional view of a display device according to an embodiment.

FIG. 1 illustrates a schematic cross-sectional view of a display device according to an embodiment. FIG. 1 is a schematic cross-sectional view of a display device, wherein a core configuration, or only a core configuration, is illustrated for purposes of description.

Referring to FIG. 1, the display device according to an embodiment has a structure in which a semiconductor layer ACT and a gate electrode GAT may be electrically connected to a data layer SD, and the semiconductor layer ACT may overlap the gate electrode GAT in a plan view (or a view in a direction perpendicular to a substrate SUB). By way of this structure, it may be possible to prevent a step between the semiconductor layer ACT and the gate electrode GAT from occurring and an erosion defect due to such a step from occurring. Other structures or configurations and effects will be described in detail later.

In FIG. 1, the term 'gate electrode GAT' is used, but the gate electrode GAT may include all layers disposed on a same layer as a gate line. For example, the gate electrode GAT may include a layer (gate layer) disposed on a same layer as the gate line.

Referring to FIG. 1, a barrier layer BL may be disposed on the substrate SUB. The semiconductor layer ACT may be disposed on the barrier layer BL. A gate insulating film GI may be disposed on a portion of or a part of the semiconductor layer ACT, and the gate electrode GAT may be disposed on the gate insulating film GI. For example, the gate electrode GAT and the semiconductor layer ACT may overlap each other with the gate insulating film GI interposed therebetween. The gate electrode GAT and the gate insulating film GI may be etched in a same process, and the gate insulating film GI may be disposed in an area overlapping the gate electrode GAT and in some of or part of an area adjacent to the overlapping area.

In an embodiment, an area (or length) of the gate insulating film GI in a direction parallel to the substrate SUB may be larger than that of the gate electrode GAT in the direction parallel to the substrate SUB. Similarly, an area (or length) of the semiconductor layer ACT in the direction parallel to the substrate SUB may be larger than that of the gate insulating film GI in the direction parallel to the substrate SUB.

As the planar area increases in an order of the area of the gate electrode GAT< (less than) the area of the gate insulating film GI< (less than) the area of the semiconductor layer ACT, it may be possible to prevent unnecessary bending from occurring in the display device. In other words, as the planar area (or lengths) of the gate electrode GAT, the gate insulating film GI, and the semiconductor layer ACT increase in a direction parallel to the substrate SUB, it may be possible to prevent unnecessary bending from occurring in the display device. Therefore, it may be possible to prevent a step caused by the bending from occurring.

An interlayer insulating film ILD may be disposed on the gate electrode GAT and the semiconductor layer ACT. The interlayer insulating film ILD may include a first opening OP1 overlapping a portion or a part of the gate electrode GAT and a second opening OP2 overlapping a portion of or a part of the semiconductor layer ACT.

A data layer SD may be disposed on the interlayer insulating film ILD. The data layer SD may be disposed on a same layer as a data line, a source electrode, and a drain electrode of the display device. Since the data layer SD may be disposed on the same layer as the data line and the like, although it is referred to as a data layer SD, the data layer SD may be separated from the data line, and a separate data signal may not be transmitted thereto. Thus, the data layer SD may function as a connecting member.

The data layer SD may be in electrical contact with the gate electrode GAT in or through the first opening OP1 and in electrical contact with the semiconductor layer ACT in or through the second opening OP2.

For example, in the display device according to an embodiment, the gate electrode GAT and the semiconductor layer ACT may be electrically connected to each other through the data layer SD.

In this case, the semiconductor layer ACT may overlap the gate electrode GAT in a plan view (or a view in a direction perpendicular to the substrate SUB). For example, since the semiconductor layer ACT may overlap the gate electrode GAT, a distance between the semiconductor layer ACT and the gate electrode GAT may be narrow in a high resolution panel, thus, it may be possible to prevent a step from occurring and to prevent an erosion defect from occurring.

In this case, a width of the area in which the semiconductor layer ACT and the gate electrode GAT overlap in a plan view (or a view in the direction perpendicular to the substrate SUB) may be about 2 μm or more.

Figure 2:
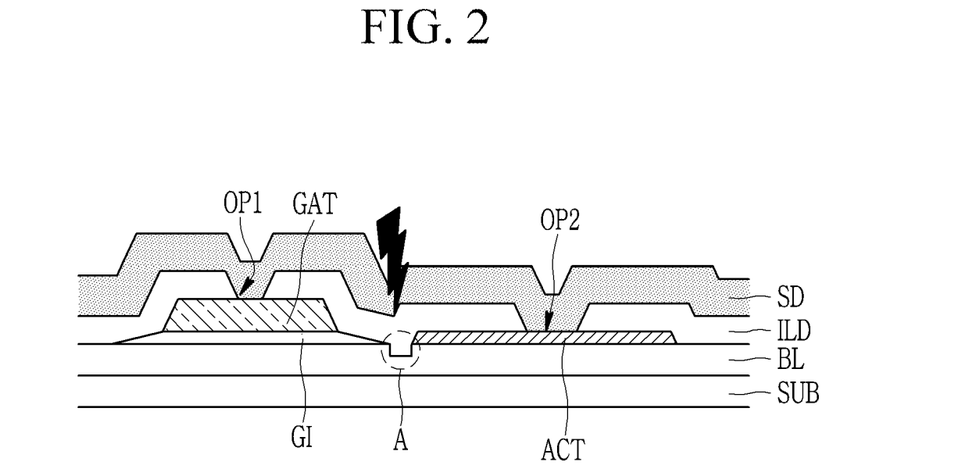
FIG. 2 illustrates a schematic cross-sectional view of a display device according to an embodiment, wherein the portions illustrated in FIG. 1 and FIG. 2 may be the same.

FIG. 2 illustrates a schematic cross-sectional view of a display device according to an embodiment, wherein the elements illustrated in FIG. 1 and FIG. 2 may be the same. The display device according to an embodiment of FIG. 2 may be the same as that of the embodiment of FIG. 1 except that the semiconductor layer ACT may not overlap the gate electrode GAT. A detailed description of the same constituent elements will be omitted.

Referring to FIG. 2, the display device according to an embodiment has a structure in which a distance between the gate electrode GAT and the semiconductor layer ACT may be short. In an etching process of forming the gate electrode GAT and the gate insulating film GI, a portion of the barrier layer BL may be etched as shown by 'A' in FIG. 2.

The etching may cause a step in a narrow area between the gate electrode GAT and the semiconductor layer ACT. Thus, layers to be stacked later in the step occurrence portion may not be properly stacked. For example, in a subsequent etching process, an etchant may penetrate into the step portion and cause an erosion defect. In FIG. 2, an area in which the etchant may penetrate to cause the erosion defect may be illustrated by an arrow.

Figure 3:
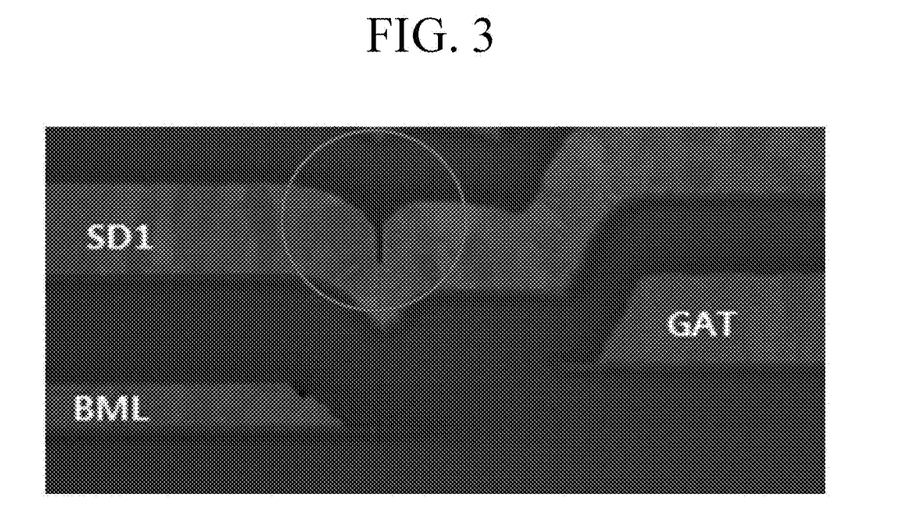
FIG. 3 illustrates an image of an erosion defect caused by an etchant in the display device having the structure as illustrated in FIG. 2.

FIG. 3 illustrates an image of an erosion defect caused by an etchant in the display device having the structure as illustrated in FIG. 2. Referring to a portion indicated by a circle in FIG. 3, it may be demonstrated or shown that the erosion defect has been caused by the penetration of the etchant.

However, the display device according to an embodiment may have a structure in which the semiconductor layer ACT and the gate electrode GAT may be electrically connected to the data layer SD1, wherein the semiconductor layer ACT may overlap the gate electrode GAT in a plan view (or a view in the direction perpendicular to the substrate SUB).

Therefore, even when the semiconductor layer ACT and the gate electrode GAT may be close to each other, a step may be prevented between them, and thus, an erosion defect due to the step may be prevented. Since the semiconductor layer ACT and the gate electrode GAT may be disposed close to each other without concern about occurrence of a step, it may be possible to increase an integration degree of the display panel and to increase a resolution of the display device.

Figure 4:
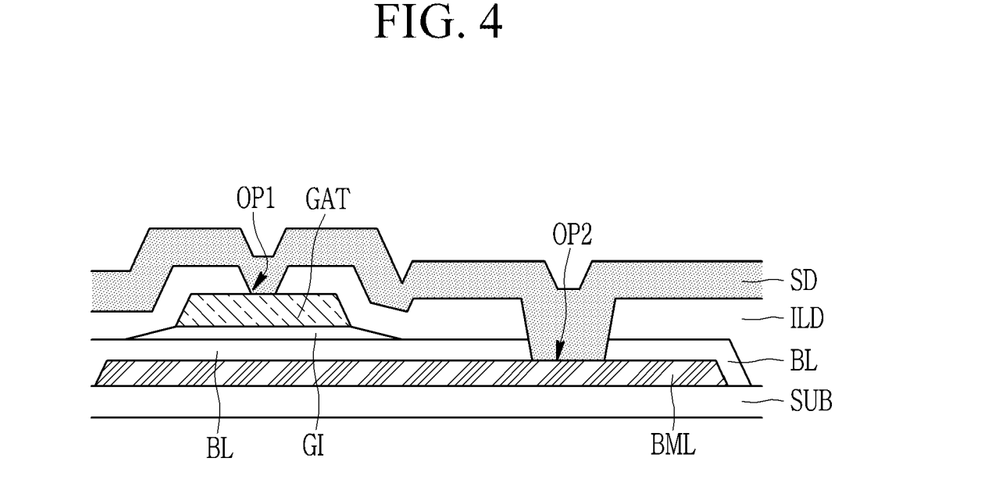
FIG. 4 illustrates a schematic cross-sectional view of a display device according to an embodiment.

FIG. 4 illustrates a schematic cross-sectional view of a display device according to an embodiment. Referring to FIG. 4, the display device according to an embodiment may include a light blocking layer BML, and the light blocking layer BML and the gate electrode GAT may be electrically connected through the data layer SD.

For example, referring to FIG. 4, the light blocking layer BML may be disposed on the substrate SUB. The barrier layer BL may be disposed on the light blocking layer BML and the substrate SUB.

The barrier layer BL may include a second opening OP2 partially overlapping the light blocking layer BML.

The gate insulating film GI may be disposed on the barrier layer BL, and the gate electrode GAT may be disposed on the gate insulating film GI.

For example, the gate electrode GAT and the semiconductor layer ACT may overlap each other with the gate insulating film GI interposed therebetween. The gate electrode GAT and the gate insulating film GI may be etched in a same process, and the gate insulating film GI may be disposed in an area overlapping the gate electrode GAT and in a portion of or part of an area adjacent to the overlapping area.

The interlayer insulating film ILD may be disposed on the gate electrode GAT and the semiconductor layer ACT. The interlayer insulating film ILD may include the first opening OP1 overlapping the gate electrode GAT. For example, the interlayer insulating film ILD may include the second opening OP2 overlapping the light blocking layer BML.

The barrier layer BL and the second opening OP2 of the interlayer insulating film ILD may be formed in a same process. For example, after the interlayer insulating film ILD is formed on the barrier layer BL, the second opening OP2 may be formed at one time.

The data layer SD may be disposed on the interlayer insulating film ILD. The data layer SD may be disposed on a same layer as a source electrode and a drain electrode of the display device.

The data layer SD may be in electrical contact with the gate electrode GAT in the first opening OP1, and may be in electrical contact with the light blocking layer BML in the second opening OP2.

For example, in the display device according to an embodiment, the gate electrode GAT and the light blocking layer BML may be electrically connected to each other through the data layer SD.

In this case, the light blocking layer BML may overlap the gate electrode GAT in a plan view (or a view in the direction perpendicular to the substrate SUB). For example, since the light blocking layer BML may overlap the gate electrode GAT, a distance between the light blocking layer BML and the gate electrode GAT may be narrow in a high resolution panel. Thus, it may be possible to prevent a step from occurring and to prevent an erosion defect from occurring.

In this case, a width of the area in which the light blocking layer BML overlaps the gate electrode GAT in a plan view (or a view in the direction perpendicular to the substrate SUB) may be about 2 μm or more.

In an embodiment, an area (or length) of the gate insulating film GI in a direction parallel to the substrate SUB may be larger than that of the gate electrode GAT in the direction parallel to the substrate SUB. Similarly, an area (or length) of the light blocking layer BML in the direction parallel to the substrate SUB may be larger than that of the gate insulating film GI in the direction parallel to the substrate SUB.

As the planar area increases in an order of the area of the gate electrode GAT<(less than) the area of the gate insulating film GI<(less than) the area of the light blocking layer BML, it may be possible to prevent unnecessary bending from occurring in the display device. In other words, as the planar area (or lengths) of the gate electrode GAT, the gate insulating film GI, and the light blocking layer BML increase in a direction parallel to the substrate SUB, it may be possible to prevent unnecessary bending from occurring in the display device. Therefore, it may be possible to prevent a step caused by the bending from occurring.

Figure 5:
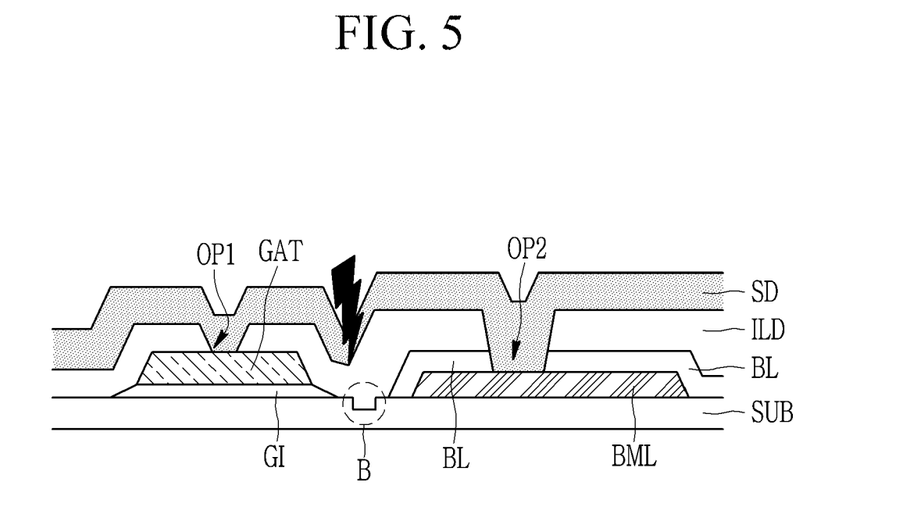
FIG. 5 illustrates a schematic cross-sectional view of a display device according to an embodiment, wherein the portions illustrated in FIG. 4 and FIG. 5 may be the same.

FIG. 5 illustrates a schematic cross-sectional view of a display device according to an embodiment, wherein the portions illustrated in FIG. 4 and FIG. 5 may be the same. The display device according to an embodiment of FIG. 5 may be the same as that of the embodiment of FIG. 4, except that the light blocking layer BML may not overlap the gate electrode GAT. A detailed description of the same components will be omitted.

Referring to FIG. 5, the display device according to an embodiment has a structure in which a distance between the gate electrode GAT and the light blocking layer BML may be short. In an etching process of forming the gate electrode GAT and the gate insulating film GI, a portion of the barrier layer BL may be etched as shown by 'B' in FIG. 5.

The etching may cause a step in a narrow area between the gate electrode GAT and the light blocking layer BML, thus layers to be stacked later in the step occurrence portion may not be properly stacked. For example, in a subsequent etching process, an etchant may penetrate into the step portion and cause an erosion defect. In FIG. 5, an area in which the etchant may penetrate to cause the erosion defect may be illustrated by an arrow.

However, as shown in FIG. 4, the display device according to an embodiment has a structure in which the light blocking layer BML and the gate electrode GAT may be electrically connected to the data layer SD, wherein the light blocking layer BML may overlap the gate electrode GAT in a plan view (or a view in the direction perpendicular to the substrate SUB). The barrier layer BL may thus be continuous with respect to the gate electrode GAT and the light blocking layer BML.

Therefore, even when the light blocking layer BML and the gate electrode GAT may be close to each other, a step may be prevented between them, and thus, an erosion defect due to the step may be prevented. Since the light blocking layer BML and the gate electrode GAT may be disposed close to each other, it may be possible to increase an integration degree of the display panel and to increase a resolution of the display device.

Figure 6:
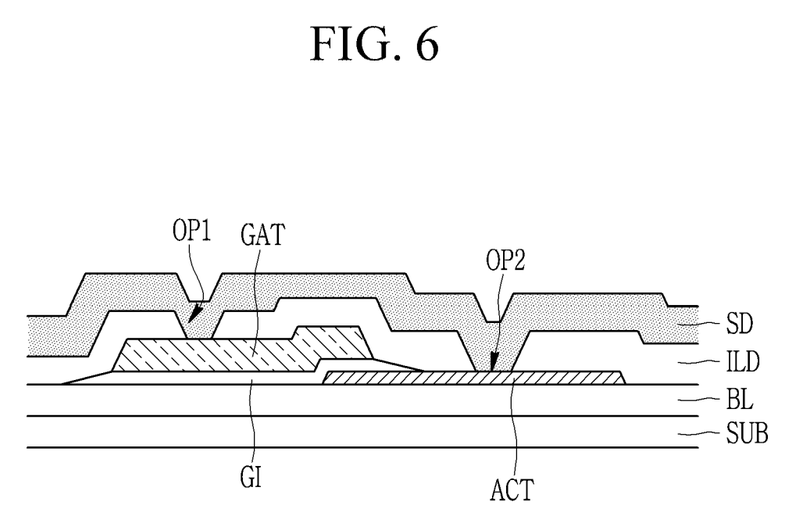
FIG. 6 illustrates a schematic cross-sectional view of a display device according to an embodiment, wherein the portions illustrated in FIG. 6 and FIG. 1 may be the same.

FIG. 6 illustrates a schematic cross-sectional view of a display device according to an embodiment, wherein the elements illustrated in FIG. 6 and FIG. 1 may be the same.

Referring to FIG. 6, the display device according to an embodiment may be the same as that of the embodiment of FIG. 1, except that the semiconductor layer ACT may partially overlap the gate electrode GAT. A detailed description of the same components will be omitted.

For example, in the display device according to an embodiment of FIG. 1, the entire gate electrode GAT may overlap the semiconductor layer ACT. However, in the display device according to an embodiment of FIG. 6, a portion of or a part of the gate electrode GAT may overlap the semiconductor layer ACT. In this case, since it may be possible to prevent a step between the gate electrode GAT and the semiconductor layer ACT from occurring, it may provide the same effect as in FIG. 1.

For example, the step that may occur between the gate electrode GAT and the semiconductor layer ACT may be prevented while the semiconductor layer ACT may be extended to partially overlap the gate electrode GAT.

In this case, a width of the area in which the semiconductor layer ACT overlaps the gate electrode GAT in a plan view (or a view in the direction perpendicular to the substrate SUB) may be about 2 μm or more. This is a minimal overlap area to prevent occurrence of the step and penetration of the etchant.

The above-described embodiment may be applied to various areas of the display device without limitation when the various areas of the display device correspond a portion in which the semiconductor layer ACT and the gate electrode GAT may be electrically connected to the data layer SD, or a portion in which the light blocking layer BML and the gate electrode GAT may be electrically connected through the data layer SD. For example, the above-described structure is not limited to a pixel in the display area of the display device, but may be applied to a non-display area and/or a pad portion.

For example, when the semiconductor layer ACT may overlap the gate electrode GAT in the structure in which the semiconductor layer ACT and the gate electrode GAT may be electrically connected to the data layer SD in the display device, or when the light blocking layer BML may overlap the gate electrode GAT in the structure in which the light blocking layer BML and the gate electrode GAT may be electrically connected through the data layer SD, a structure related thereto may be included in the within the spirit and the scope of the disclosure.

However, hereinafter, although an embodiment will be described with reference to a specific drawing, since the embodiment is an example, the disclosure is not limited by a following structure.

Figure 7:
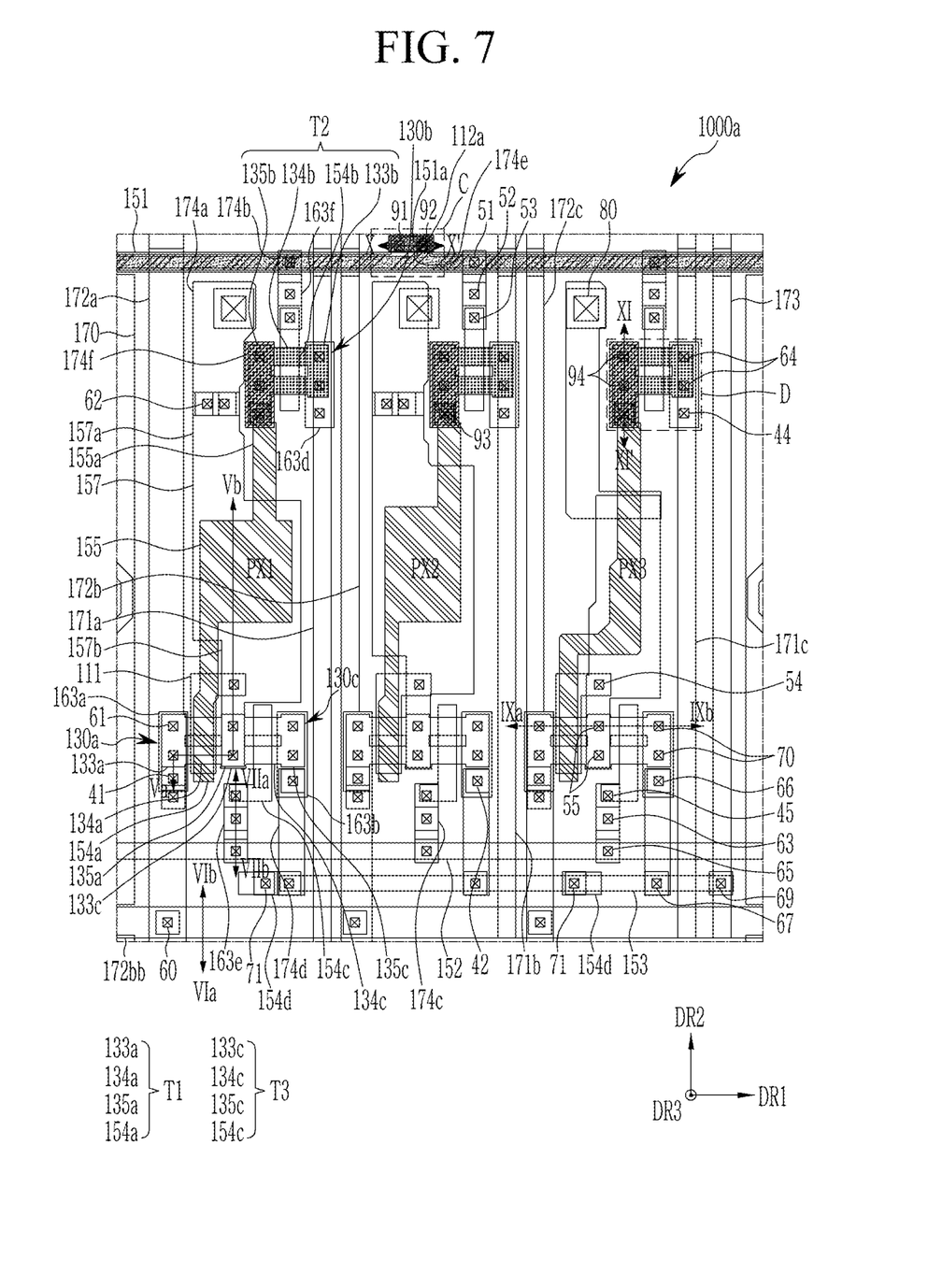
FIG. 7 illustrates a plan layout view of pixels of a display device according to an embodiment.
Figure 8:
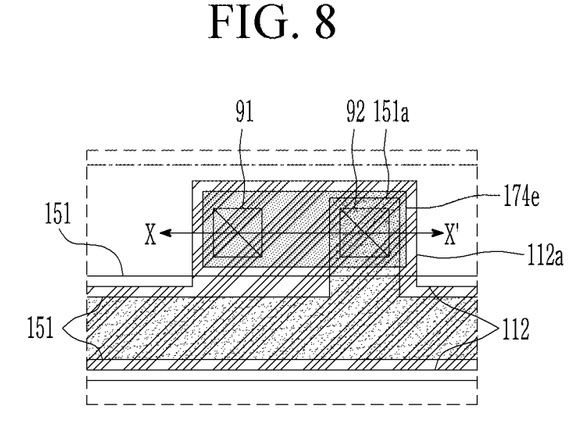
FIG. 8 illustrates an enlarged view of an area indicated by C of FIG. 7.
Figure 9:
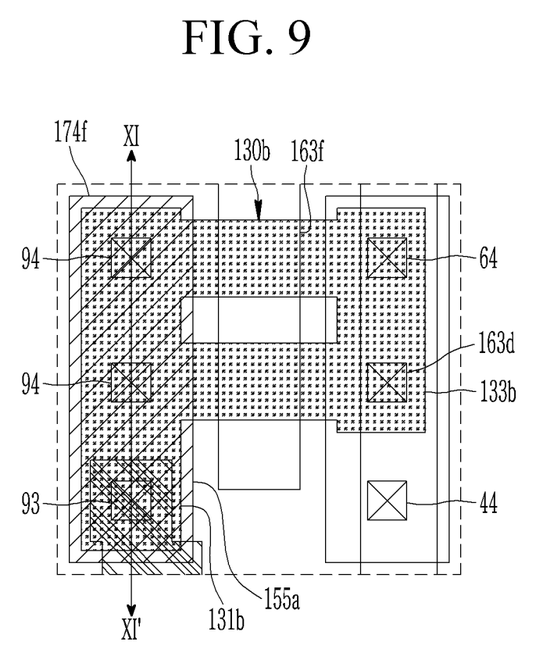
FIG. 9 illustrates an enlarged view of an area indicated by D of FIG. 7.

FIG. 7 illustrates a planar layout view of pixels PX1, PX2, and PX3 of a display device according to an embodiment, FIG. 8 illustrates an enlarged view of an area indicated by 'C' of FIG. 7, and FIG. 9 illustrates an enlarged view of an area indicated by 'D' of FIG. 7.

Figure 10:
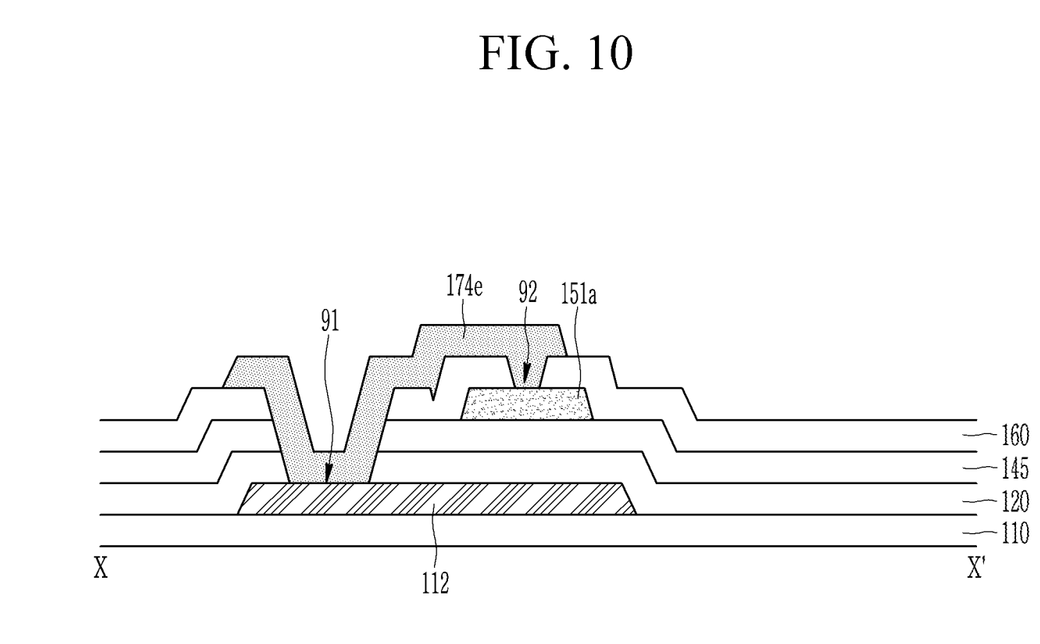
FIG. 10 illustrates a schematic cross-sectional view taken along line X-X' of FIG. 7 and FIG. 8.
Figure 11:
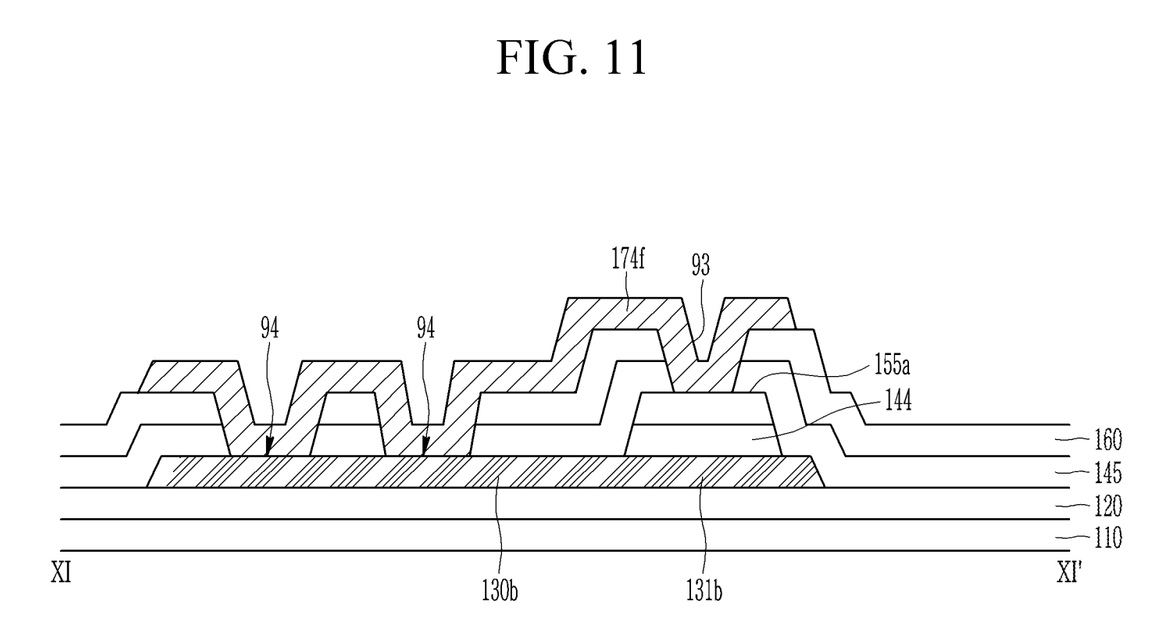
FIG. 11 illustrates a schematic cross-sectional view taken along line XI-XI' of FIG. 7 and FIG. 9.

FIG. 10 illustrates a schematic cross-sectional view taken along line X-X' of FIG. 7 and FIG. 8, and FIG. 11 illustrates a schematic cross-sectional view taken along line XI-XI' of FIG. 7 and FIG. 9.

Referring to FIG. 7 to FIG. 11, the display device 1000a according to an embodiment may include a substrate 110. The substrate 110 may include an insulating material such as glass, plastic, or the like, and may be flexible, bendable or rollable.

A barrier layer (not shown), which may be an insulating layer, may be disposed on the substrate 110, and a lower pattern 111 may be disposed thereon as a first conductive layer. The lower pattern may be conductive, and may include various conductive metals or a semiconductor material having conductive properties equivalent to the various conductive metals.

Referring to FIG. 7 to FIG. 11, a lower wire 112 may be disposed on a same layer as the lower pattern 111. The lower wire 112 may overlap a first scan line 151 in a plan view (or a view in the direction perpendicular to the substrate), and may extend along a first direction DR1.

The lower wire 112 may include an extension portion 112a protruding in a second direction DR2. The extension portion 112a may be a portion to be electrically connected to the first scan line 151 later. For example, the extension portion 112a of FIG. 7 and FIG. 8 may be a portion corresponding to the light blocking layer BML overlapping the gate electrode GAT in an embodiment of FIG. 4. A connection structure will be separately described in detail.

A buffer layer 120, which may be an insulating layer, may be disposed on the lower pattern 111 and the lower wire 112. For example, the lower pattern 111 and the lower wire 112 may be disposed between the substrate 110 and the buffer layer 120.

An active layer including active patterns 130a, 130b, and 130c may be disposed on the buffer layer 120. For example, the lower pattern 111 may be disposed between the substrate 110 and the active layer. The active patterns 130a, 130b, and 130c disposed in the first, second, and third conductive pixels PX1, PX2, and PX3 may include channel regions 134a, 134b, and 134c that may form respective channels of transistors T1, T2, and T3, and a conductive region electrically connected to the channel regions 134a, 134b, and 134c. The conductive regions of the active patterns 130a, 130b, and 130c may include source regions 133a, 133b, and 133c and drain regions 135a, 135b, and 135c of respective transistors T1, T2, and T3. In each of the pixels PX1, PX2, and PX3, the first active pattern 130a and the third active pattern 130c may be electrically connected to each other.

The active layer may include a semiconductor material such as amorphous silicon, polycrystalline silicon, or an oxide semiconductor.

Referring simultaneously to FIG. 7, FIG. 9, and FIG. 11, the active pattern 130b disposed in the second pixel PX2 may include a protrusion 131b extending in the second direction DR2. The protrusion 131b may correspond to the semiconductor layer ACT overlapping the gate electrode GAT as previously described.

An insulating pattern 144, which may be a first insulating layer, may be disposed on the active layer.

A second conductive layer may be disposed on the insulating pattern 144. The second conductive layer may include a driving gate electrode 155 including a first gate electrode 154a, a second gate electrode 154b, a third gate electrode 154c, and a gate pattern 154d.

The driving gate electrode 155 may include an extension portion 155a that may protrude upward and substantially extend in a second direction DR2, and the first gate electrode 154a that may protrude downward and substantially extend in the second direction DR2. The driving gate electrode 155 disposed in the third pixel PX3 may have a smaller area than the driving gate electrode 155 disposed in the other pixels PX1 and PX2.

Referring simultaneously to FIG. 7 and FIG. 9, the extension portion 155a of the driving gate electrode 155 may overlap the protrusion 131b of the active pattern 130b. This may be an area corresponding to an embodiment of FIG. 1 and FIG. 6 described above. For example, the active pattern 130b and the protrusion 131b may correspond to the semiconductor layer ACT in FIG. 1 and FIG. 6, and the driving gate electrode 155 and the extension portion 155a may correspond to the gate electrode GAT in FIG. 1 and FIG. 6.

The first gate electrode 154a may cross the first active pattern 130a, and overlap the channel region 134a of the active pattern 130a. The second gate electrode 154b may cross the active pattern 130b, and overlap the channel region 134b of the second active pattern 130b. The third gate electrode 154c may cross the third active pattern 130c, and overlap the channel region 134c of the third active pattern 130c. The gate pattern 154d may be electrically connected to an initializing voltage line 153 through a contact hole 71.

A second insulating layer 145 may be disposed on the second conductive layer.

A third conductive layer may be disposed on the second insulating layer 145. The third conductive layer may include a first scan line 151 that may transmit a first scan signal, a second scan line 152 that may transmit a second scan signal, a horizontal initializing voltage line 153 that may transmit an initializing voltage, a horizontal driving voltage line 172bb that may transmit a driving voltage, a capacitor electrode 157, and connecting electrodes 163a, 163b, 163d, 163e, and 163f.

The first and second scan lines 151 and 152, the horizontal initializing voltage line 153, and the horizontal driving voltage line 172bb may extend in the first direction DR1, respectively. The capacitor electrode 157 may be disposed between the first scan line 151 and the second scan line 152.

The first scan line 151 may overlap the lower wire 112. Referring simultaneously to FIG. 7, FIG. 8, and FIG. 9, the first scan line 151 may include an extension portion 151a, and the extension portion 151a of the first scan line 151 may overlap an extension portion 112a of the lower wire 112.

Referring to FIG. 7 to FIG. 9, an area of the extension portion 151a of the first scan line 151 may be smaller than that of the extension portion 112a of the lower wire 112.

The second gate electrode 154b may be electrically connected to the connecting electrode 163f through a contact hole 53. The second gate electrode 154b may be electrically connected to the first scan line 151 through the connecting electrode 163f. The third gate electrode 154c may be electrically connected to the fifth connecting electrode 163e through a contact hole 45, and may be electrically connected to the second scan line 152 through the fifth connecting electrode 163e.

The capacitor electrode 157 disposed in the respective pixels PX1, PX2, and PX3 may include a first extension portion 157a that may protrude upward and substantially extend in a second direction DR2, and a second extension portion 157b that may protrude downward and substantially extend in the second direction DR2.

The second extension portion 157b of the capacitor electrode 157 may be electrically connected to the lower pattern 111 through a contact hole 54. As an example, an end portion of the second extension portion 157b may be electrically connected to the active patterns 130a and 130b through one or more contact holes 55.

The first connecting electrode 163a may be electrically connected to a driving voltage line 172a through one or more contact holes 41. The second connecting electrode 163b may be electrically connected to a fourth connecting pattern 174d through one or more contact holes 42. The fourth connecting electrode 163d may be electrically connected to a data line 171a through a contact hole 44. The fifth connecting electrode 163e may be electrically connected to the third gate electrode 154c through the contact hole 45, and the other portion of the fifth connecting electrode 163e may be electrically connected to a connecting pattern 174c through a contact hole 63.

The second connecting electrode 163b may be electrically connected to the active pattern 130c through one or more contact holes 70.

The third conductive layer may be a triple layer including titanium/aluminum/titanium. In the third conductive layer, a thickness of titanium may be in a range of about 400 Å to about 800 Å, and a thickness of aluminum may be in a range of about 5000 Å to about 7000 Å.

A third insulating layer 160 may be disposed on the third conductive layer.

The fourth conductive layer may be disposed on the third insulating layer 160. The fourth conductive layer may include data lines 171a, 171b, and 171c, driving voltage lines 172a, 172b, and 172c, a common voltage line 170, an initializing voltage line 173, and connecting patterns 174a, 174b, 174c, 174d, 174e, and 174f.

The data lines 171a, 171b, and 171c, the driving voltage lines 172a, 172b, and 172c, the common voltage line 170, and the initializing voltage line 173 may substantially extend in the second direction DR2 to cross the first scan line 151 and/or the second scan line 152, respectively.

The pixels PX1, PX2, and PX3 as one repeated group shown in FIG. 7 may be arranged or disposed in the first direction DR1 and adjacent to each other. The common voltage line 170 may be disposed on both the left and right sides of the pixels PX1, PX2, and PX3 of one group. For example, one common voltage line 170 may be disposed for each of the pixels PX1, PX2, and PX3 as the one repeated group. When the pixels PX1, PX2, and PX3 as the one repeated group include three pixels PX1, PX2, and PX3, three data lines 171a, 171b, and 171c, the driving voltage lines 172a, 172b, and 172c, and at least one initializing voltage line 173 may be disposed between two neighboring common voltage lines 170.

Each of the data lines 171a, 171b, and 171c may be electrically connected to the source region 133b of the active pattern 130b through at least one contact hole 64 of the second insulating layer 145 and the third insulating layer 160.

In FIG. 7, each of the driving voltage lines 172a, 172b, and 172c may be disposed at each of the pixels PX1, PX2, and PX3, but the driving voltage line 172a may be disposed at one pixel, for example, the pixel PX1, and a driving voltage pattern electrically connected to the driving voltage line may be disposed in each of the remaining pixels PX2 and PX3.

Each of the driving voltage lines 172a, 172b, and 172c may be electrically connected to the source region 133a of the active pattern 130a through at least one contact hole 61 (two contact holes 61 are shown in FIG. 7) of the second insulating layer 145 and the third insulating layer 160. Each of the driving voltage lines 172a, 172b, and 172c may be electrically connected to the horizontal driving voltage line 172bb through at least one contact hole 60 of the second insulating layer 145 and the third insulating layer 160.

Accordingly, the horizontal driving voltage line 172bb may transmit the driving voltage together with the driving voltage lines 172a, 172b, and 172c, and the driving voltage may be transmitted in a mesh or grid form in all directions of the display device including the first direction DR1 and the second direction DR2.

The initializing voltage line 173 may be electrically connected to the horizontal initializing voltage line 153 through a contact hole 69 of the second and third insulating layers 145 and 160. Therefore, the horizontal initializing voltage line 153 may transmit the initializing voltage together with the initializing voltage line 173, and even if the initializing voltage line 173 is formed for each of the three pixels PX1, PX2, and PX3, the initializing voltage may be transmitted to all of the three pixels PX1, PX2, and PX3 through the horizontal initializing voltage line 153.

The first connecting pattern 174a may be electrically connected to the capacitor electrode 157 through a contact hole 62 of the second insulating layer 145 and the third insulating layer 160. The first connecting pattern 174a may be electrically connected to the first electrode (not shown) through a contact hole 80.

The second connecting pattern 174b may electrically connect the first scan line 151 and the connecting electrode 163f to each other through a contact hole 51 and a contact hole 52. The connecting electrode 163f may be electrically connected to the second gate electrode 154b through a contact hole 53.

The third connecting pattern 174c may be electrically connected to the fifth connecting electrode 163e through a contact hole 63, and may be electrically connected to the second scan line 152 through a contact hole 65.

The fourth connecting pattern 174d may be electrically connected to the second connecting electrode 163b through a contact hole 66, and may be electrically connected to the initializing voltage line 153 through a contact hole 67.

The fifth connecting pattern 174e may be electrically connected to the extension portion 112a of the lower wire 112 through a contact hole 91, and may be connected to the extension portion 151a of the first scan line 151 through a contact hole 92.

The sixth connecting pattern 174f may be electrically connected to the extension portion 155a of the driving gate electrode 155 through a contact hole 93, and may be electrically connected to the protrusion 131b of the active pattern 130b through a contact hole 94.

For example, referring to FIG. 7, FIG. 8, and FIG. 10, a configuration in which the lower wire 112 and the first scan line 151 may be electrically connected through the fifth connecting pattern 174e may correspond to that of the embodiment of FIG. 4 described above. In this case, since the extension portion 112a of the lower wire 112 and the extension portion 151a of the first scan line 151 may overlap, even if an interval between the extension portion 112a of the lower wire 112 and the extension portion 151a of the first scan line 151 may be narrow, it may be possible to prevent a step from occurring.

Similarly, referring to FIG. 7, FIG. 9, and FIG. 11, the configuration in which the driving gate electrode 155 and the active pattern 130b may be electrically connected through the sixth connecting pattern 174f may correspond to that of the embodiment of FIG. 1 and FIG. 6 described above. In this case, since the protrusion 131b of the active pattern 130b may overlap the extension portion 155a of the driving gate electrode 155, even if an interval between the active pattern 130b and the driving gate electrode 155 may be narrow, it may be possible to prevent a step from occurring.

The horizontal initializing voltage line 153 may extend in the first direction DR1 across the three adjacent pixels PX1, PX2, and PX3, but may be disposed between two adjacent common voltage lines 170 and may not intersect the two common voltage lines 170. The horizontal initializing voltage line 153 may intersect the three neighboring data lines 171a, 171b, and 171c, and may extend only to the initializing voltage line 173.

The first connecting pattern 174a and the first electrode (not shown) of the pixel electrode layer may be electrically connected through a contact hole 80.

Each first electrode (not shown) may be electrically connected to the drain region 135a of the first transistor T1 via the capacitor electrode 157 and the first connecting pattern 174a to receive a voltage from the first transistor T1.

As described above, in the display device according to an embodiment, the semiconductor layer may overlap the gate electrode in the structure in which the semiconductor layer and the gate electrode may be electrically connected to the data layer, or the light blocking layer may overlap the gate electrode in the structure in which the light blocking layer and the gate electrode may be electrically connected through the data layer, thereby preventing occurrence of a step. Therefore, it may be possible to prevent penetration of an etchant in a step area and an erosion defect due to the penetration of the etchant, thereby stably realizing a panel with high resolution.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a substrate;
   a semiconductor layer disposed on the substrate;
   a gate insulating film disposed on the semiconductor layer;
   a gate layer disposed on the gate insulating film and insulated from the semiconductor layer;
   an insulating film disposed on the semiconductor layer and the gate layer; and
   a metal layer disposed on the insulating film,
   wherein the semiconductor layer and the gate layer are electrically connected through the metal layer with the metal layer directly, contracting the semiconductor layer, and
   the semiconductor layer overlaps the gate layer in a plan view.

2. The display device of claim 1, wherein
   the insulating film includes a first opening overlapping the gate layer and a second opening overlapping the semiconductor layer,
   the metal layer and the gate layer electrically contact each other through the first opening, and
   the metal layer and the semiconductor layer electrically contact each other through the second opening.

3. The display device of claim 1, wherein the gate layer is a gate electrode.

4. The display device of claim 1, wherein
   the display device includes a data line, and
   the metal layer and the data line are disposed on a same layer.

5. The display device of claim 1, wherein an entire area of the gate layer overlaps the semiconductor layer.

6. The display device of claim 1, wherein the gate layer partially overlaps the semiconductor layer.

7. The display device of claim 1, wherein the gate layer and the gate insulating film are formed by a same etching process.

8. The display device of claim 1, further comprising a barrier layer disposed between the semiconductor layer and the substrate.

9. The display device of claim 8, wherein,
   the barrier makes direct contact with both the gate insulating film and the semiconductor layer.

10. The display device of claim 1, wherein a width of an area in which the semiconductor layer and the gate layer overlap in a plan view is about 2 μm or more.

11. The display device of claim 1, wherein no electrically conductive layer is disposed directly between the semiconductor layer and the substrate.

* * * * *